United States Patent

Oguro et al.

[11] 4,314,226
[45] Feb. 2, 1982

[54] PRESSURE SENSOR

[75] Inventors: Takeshi Oguro, Yokosuka; Teruyoshi Mihara; Tamotsu Tominaga, both of Yokohama; Masami Takeuchi, Kokubunji, all of Japan

[73] Assignee: Nissan Motor Company, Limited, Yokohama, Japan

[21] Appl. No.: 109,489

[22] Filed: Jan. 4, 1980

[30] Foreign Application Priority Data

Feb. 2, 1979 [JP] Japan .................. 54-11583[U]

[51] Int. Cl.³ ................................ G01L 1/22
[52] U.S. Cl. ......................... 338/4; 73/727; 338/42; 357/26
[58] Field of Search ............ 338/2, 4, 36, 42; 357/26, 48; 73/720, 721, 726, 727

[56] References Cited

U.S. PATENT DOCUMENTS

| 3,885,999 | 5/1975 | Fusaroli et al. | 357/48 |
| 3,971,059 | 7/1976 | Dunkley et al. | 357/48 |
| 4,035,823 | 7/1977 | Marshall | 357/26 |
| 4,040,297 | 8/1977 | Karsmakers | 338/4 X |
| 4,095,252 | 6/1978 | Ochi | 357/48 |
| 4,125,820 | 11/1978 | Marshall | 338/4 |
| 4,129,042 | 12/1978 | Rosvold | 73/727 X |
| 4,205,556 | 6/1980 | Runyan | 338/4 X |

FOREIGN PATENT DOCUMENTS

| 1179876 | 2/1970 | United Kingdom . |
| 1248087 | 9/1971 | United Kingdom . |
| 1488731 | 10/1977 | United Kingdom . |
| 1558815 | 1/1980 | United Kingdom . |

*Primary Examiner*—C. L. Albritton
*Attorney, Agent, or Firm*—Schwartz, Jeffery, Schwaab, Mack, Blumenthal & Koch

[57] ABSTRACT

A pressure sensor having a silicon diaphragm whose opposite surfaces are subjected to fluid pressures for measurement. The diaphragm includes a diffused resistor as a pressure-sensitive element on a silicon base, a protective layer composed of a silicon epitaxial layer opposite in conductive type to the resistor and formed on the diffused resistor in order to prevent the resistor from being exposed to a corresponding fluid pressure, and an electrically insulating layer formed on an outer surface of the protective layer.

5 Claims, 6 Drawing Figures

PRESSURE SENSOR

BACKGROUND OF THE INVENTION

The present invention relates to a pressure sensor and particularly to a pressure sensor of the type having a semiconductor diaphragm on which a diffused resistor is formed as a pressure-sensitive element using the piezoresistivity effect.

A variety of semiconductor pressure sensors have been proposed which use the piezoresistivity effect of a semiconductor material constituting the sensors, as shown in FIGS. 1, 2 and 3 of the accompanying drawings. These sensors designated by reference numeral 10, include a silicon diaphragm block 12 which is composed of a diaphragm 14 and a peripheral support 16 formed from a silicon chip using etching techniques. The diaphragm 14 includes diffused resistors 18 formed as a pressure-sensitive element on a front surface 14a thereof. The opposite surface 14b of the diaphragm 14 formed using the etching techniques is subjected to a fluid pressure to be measured.

A typical semiconductor pressure sensor 10 shown in FIG. 1 includes an alumina base 20 to which the diaphragm block 12 is bonded by means of a bonding material 22 such that the front surface 14a on which the resistors 18 are formed is disposed so as to be subjected to a vacuum 24 within a package 25 formed by the base 20 and a cap 26 which is sealingly secured to the base 20 and which covers the diaphragm block 12. A fluid pressure subject to measurement is introduced through an inlet pipe 28 connected to the base 20 and a hole 30 provided in the base 20 so as to arrive at the back surface 14b of the diaphragm 14.

A semiconductor pressure sensor shown in FIG. 2 includes a silicon diaphragm block 12 and a silicon support plate 32 bonded thereto so as to form a vacuum chamber 34 therebetween. In this case, the diaphragm block 12 and the support plate 32 are of the same linear coefficient of thermal expansion in order to prevent thermal stress which may otherwise be produced in the diaphragm 14 due to the difference in linear coefficient of thermal expansion between the diaphragm 14 and the alumina base 20 if the diaphragm block 12 should be directly bonded to the base 20.

The support plate 32 is secured at its center to the base 20 by means of a bonding material 36. A fluid subject to measurement is introduced through an inlet pipe 28, a hole 30 in the base 20 and the inside of the cap 26 so as to arrive at the front surface 14a of the diaphragm 14.

A pressure sensor shown in FIG. 3 is of the same structure as the sensor in FIG. 1 except that the cap 26 is provided with a hole 38 therein and an inlet pipe 40 connected to the cap so as to communicate with the hole. Two fluid pressures are introduced through the inlet pipe 28 and the hole 30 and through the inlet pipe 40 and the hole 38 so as to arrive at the opposite surfaces 14b and 14a, respectively, of the diaphragm 14 thereby making it possible to obtain the differential between the two fluid pressures.

FIG. 4 shows an enlarged cross-section of a pressure-sensitive silicon diaphragm block used in a prior art pressure sensor such as shown in FIGS. 1 to 3. In the example, the diaphragm block 12 includes an N type silicon base 140 which has on one surface diffused resistors 18 containing P type impurities, a silicon dioxide film 142 formed on the base 140 and on the diffused resistors 18, and aluminum leads 144 formed on the film 142 and electrically connected to the resistors 18. If this diaphragm block is sealingly accommodated within the package such that the surface of the diaphragm on which the diffused resistors are formed faces the vacuum within the package, there will no problem that the diffused resistors deteriorate. However, if the diffused resistors on the diaphragm are exposed to a fluid subject to measurement, as shown in FIGS. 2 and 3, which is required for providing connections to the resistors 18, or for obtaining the differential pressure, provision of only the silicon dioxide film 142 on the diffused resistors 18 will be insufficient to prevent external permeation of moisture and impurity ions (especially sodium ions), which may be contained in the fluid subject to measurement, between the diffused resistors 18 and the film 142 with the result that the electrical characteristics of the silicon interface tends to be unstable, as is well known; the resistors are liable to deteriorate due to the moisture and corrosive gases or the like, thereby resulting in a change in the output characteristic of the sensor

SUMMARY OF THE INVENTION

It is therefore an object of the present invention to provide a semiconductor pressure sensor which prevents diffused resistors formed in its diaphragm from deterioration due to exposure to a fluid whose pressure is subject to measurement.

Another object of the present invention is to provide a semiconductor pressure sensor which has a thermally stable mechanical strength.

Other objects, features and advantages of the present invention will be apparent from the following description, taken in conjunction with the accompanying drawings.

DETAILED DESCRIPTION OF THE PREFERRED EMBODIMENTS

Figure 1:
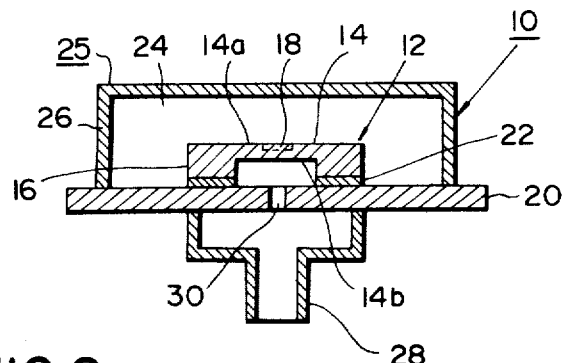
FIGS. 1, 2 and 3 are cross-sectional views of different prior art semiconductor pressure sensors, respectively.

The same or similar reference numeral designates corresponding parts and portions throughout the accompanying drawings.

Figure 2:
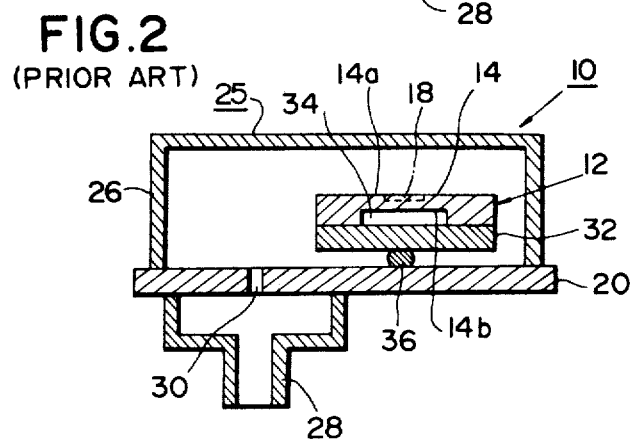
Figure 3:
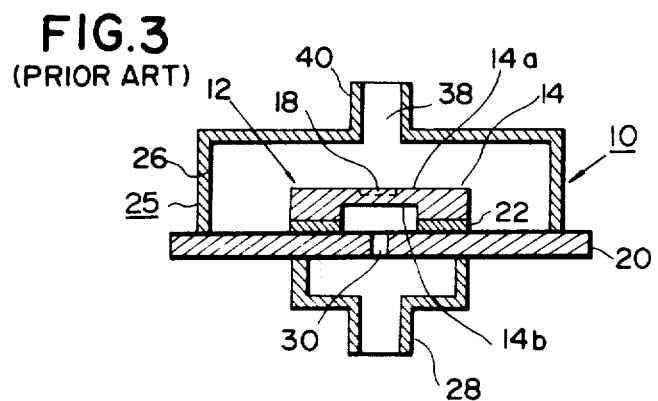
Figure 4:
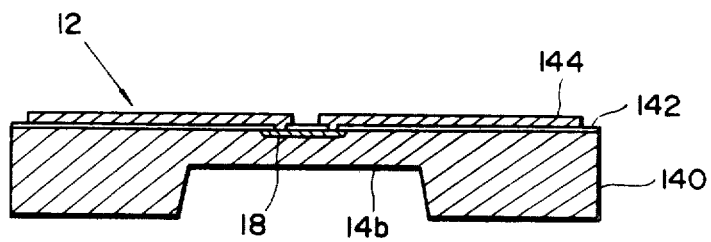
FIG. 4 is a cross-sectional view of a diaphragm block used in the sensors shown in FIGS. 1 to 3.
Figure 5:
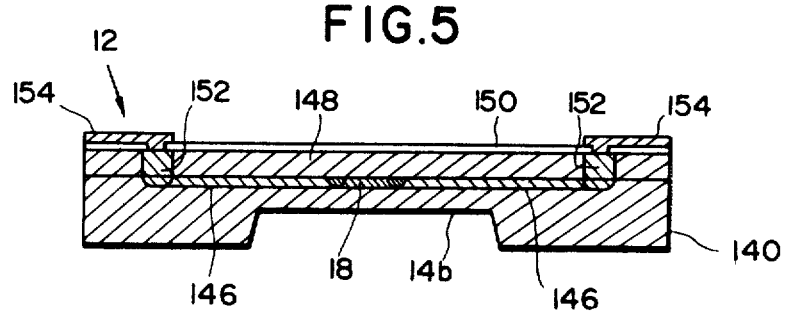
FIG. 5 is a view, similar to FIG. 4, of a diaphragm block used in a semiconductor pressure sensor according to the present invention.

In FIG. 5 is shown a diaphragm block 12 used in a pressure sensor according to the present invention, the diaphragm block being mounted within a package (not shown) such as shown by 25 in FIGS. 1 to 3, in the same way as in FIGS. 1 to 3. The diaphragm block 12 includes an N type silicon base 140, P type diffused resistors 18 formed in a part or central portion of the base 140, P+ diffused leads 146 electrically connected to the resistors 18 and formed on the same flat surface of the base 140, a protective layer including a silicon epitaxial layer 148 formed on the silicon base 140, opposite in conductive type to the resistors 18, (i.e. of an N type) and covering the resistors 18 and the diffused leads 146, an electrically insulating silicon dioxide layer 150 formed on the silicon epitaxial layer 148, joints composed of small P+ diffused areas 152 reaching at the diffused leads 146 from the surface of the epitaxial layer and aluminum connections or leads 154 disposed on the silicon dioxide film 150 and electrically connected to the P+ diffused areas 152 through the silicon dioxide film 150. The N type silicon epitaxial layer 148 is isolated by a PN junction from each of the P type diffused resistors 18, the P+ type diffused leads 146 and the P+ type diffused areas 152. A few microns (μm) suffice for the thickness of the epitaxial layer 148. As mentioned above, the silicon base 140 is provided with a back surface 14b formed using etching techniques and subject to a fluid pressure for measurement.

Figure 6:
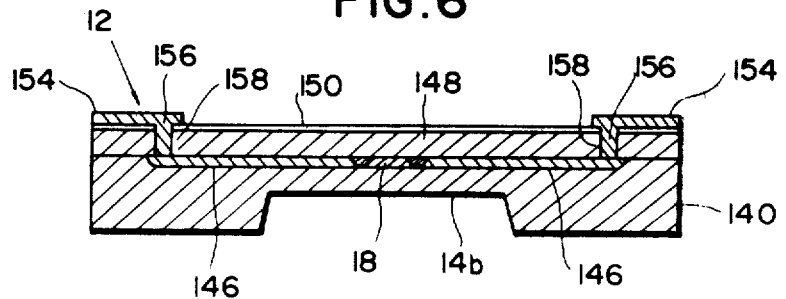
FIG. 6 is a modification of the diaphragm block of FIG. 5.

In FIG. 6 is shown a modification of the diaphragm block 12 used in the pressure sensor according to the present invention. This modification is the same as the diaphragm block of FIG. 5 except that aluminum electrodes 156 are inserted in holes in the film 150 and in the epitaxial layer 148 so as to electrically connect the P+ diffused leads 146 and the aluminum connections 154. Then a heat treatment is made such that parts of the aluminum electrodes 156 are diffused into the silicon epitaxial layer 148 to form P type diffused areas 158 which in turn form PN junctions with the N type silicon epitaxial layer 148 thereby being electrically isolated from it.

The diaphragm blocks shown in FIGS. 5 and 6 can be used as components for various structurally different pressure sensors such as shown in FIGS. 1, 2 and 3. These diaphragm blocks are advantageous in that either of the opposite surfaces of each of their diaphragms can be exposed to a fluid whose pressure is to be measured, when used for the purpose of improving the thermal characteristics of the pressure sensor or for the purpose of measuring the differential pressure, especially as shown in FIGS. 2 and 3.

In the particular embodiment, the diffused resistors are covered by the silicon epitaxial layer which is finely textured and chemically stable, thereby positively preventing the diffused resistors from deterioration which makes the electrical characteristic of the resistors unstable, due to moisture and corrosive gases contained in the fluid whose pressure is subject to measurement. The use of the silicon epitaxial layer as a protective layer for the diffused resistors serves to prevent the occurrence of thermal stress in the silicon diaphragm because the silicon epitaxial layer is of substantially the same linear coefficient of thermal expansion as the silicon diaphragm.

In the embodiment of the present invention, the silicon base 140 and the epitaxial layer 148 have been disclosed and described as being of an N type, and the diffused resistors 18, the diffused leads 146 and the joints 152 as being of a P type and a P+ type respectively. However, the silicon base 140 and the epitaxial layer 148 may be of a P type, in which case, the diffused resistors 18, the diffused leads 146 and the joints 152 should be of an N type.

Although one preferred embodiment and one modification of the present invention have been disclosed and described, it is apparent that other embodiments and modifications of the invention are possible within the scope of the appended claims.

What is claimed is:

1. A pressure sensor comprising:

a package having a hollow interior space and an inlet for introducing into the hollow interior space a fluid pressure to be measured;

a silicon diaphragm block confined within and bonded to the interior space of said package, said diaphragm block including a diaphragm spaced from the inside of said package;

said diaphragm including a base layer, said base layer including a pressure-sensitive element comprising a diffused resistor on a surface thereof, and a protective layer opposite in conductive type to said resistor and covering said diffused resistor;

a plurality of aluminum electrodes extending through said protective layer;

an internal diffused layer being of the same conductive type as said diffused resistor and disposed substantially between said base and said protective layer, said internal diffused layer electrically connecting said aluminum electrodes and said diffused resistor; and diffused areas in said protective layer surrounding said aluminum electrodes, said diffused areas being opposite in conductive type to said protective layer and formed by diffusing said aluminum electrodes by a heat treatment into said protective layer.

2. A pressure sensor according to claim 1, wherein said protective layer is of substantially the same linear coefficient of thermal expansion as said base layer.

3. A pressure sensor according to claim 2, wherein said protective layer is composed of a silicon epitaxial layer.

4. A pressure sensor according to claim 1, 2, or 3 wherein said diaphragm further includes an electrically insulating layer on said protective layer and wherein said aluminum electrodes extend through said insulating layer and further extend along an outer surface of said insulating layer.

5. A pressure sensor according to claim 4, wherein said diaphragm comprises an N type silicon base layer, an N type silicon epitaxial protective layer, a P+ type internal diffused layer and P type diffused areas.

* * * * *